United States Patent
Auer et al.

(10) Patent No.: US 6,791,664 B2
(45) Date of Patent: Sep. 14, 2004

(54) LITHOGRAPHIC APPARATUS, DEVICE MANUFACTURING METHOD, AND DEVICE MANUFACTURING THEREBY

(75) Inventors: Frank Auer, Eindhoven (NL); Franciscus Andreas Cornelis Johannes Spanjers, Oirschot (NL); Jan Holterman, Delden (NL); Marinus Pieter Koster, Eindhoven (NL); Theodorus Jacobus Adrianus De Vries, Enchede (NL)

(73) Assignee: ASML Netherlands B.V., Veldhoven (NL)

( * ) Notice: Subject to any disclaimer, the term of this patent is extended or adjusted under 35 U.S.C. 154(b) by 79 days.

(21) Appl. No.: 10/050,041

(22) Filed: Jan. 17, 2002

(65) Prior Publication Data

US 2002/0149754 A1 Oct. 17, 2002

(30) Foreign Application Priority Data

Jan. 19, 2001 (EP) ............................................ 01300479

(51) Int. Cl.⁷ ......................... G03B 27/42; F16M 13/00
(52) U.S. Cl. ............................. 355/53; 355/72; 248/638
(58) Field of Search ......................... 355/53, 72, 75; 248/550, 638; 73/662

(56) References Cited

U.S. PATENT DOCUMENTS

| 5,187,519 A | 2/1993 | Takabayashi et al. |
| 5,760,881 A | 6/1998 | Miyazaki et al. |
| 5,874,190 A | 2/1999 | Tanaka |
| 5,953,105 A | 9/1999 | Van Engelen et al. |
| 6,038,013 A | 3/2000 | Ohsaki |
| 6,388,733 B1 * | 5/2002 | Hayashi ........................ 355/53 |
| 6,441,884 B1 * | 8/2002 | Takahashi et al. ............. 355/53 |

FOREIGN PATENT DOCUMENTS

| EP | 1 041 607 A1 | 10/2000 |
| GB | 2 299 867 A | 10/1996 |

OTHER PUBLICATIONS

A copy of the European Search Report issued in the corresponding European application No. 01 30 0479.

* cited by examiner

Primary Examiner—Alan Mathews
(74) Attorney, Agent, or Firm—Pillsbury Winthrop LLP (57) ABSTRACT

Vibrational movement between the top of a lens and a main plate on which the lens is mounted is reduced by attaching between the lens and the main plate a lens support which detects relative movement between the lens and the main plates using piezoelectric sensors and compensates for that movement to reduce vibration using piezoelectric actuators which are in series with the piezoelectric sensors. The control signal which is generated to actuate the actuated piezoelectrics is generated by a controller.

15 Claims, 6 Drawing Sheets

LITHOGRAPHIC APPARATUS, DEVICE MANUFACTURING METHOD, AND DEVICE MANUFACTURING THEREBY

BACKGROUND OF THE INVENTION

The present invention claims priority from European Patent application No. 01300479.1 filed Jan. 19, 2001 and herein incorporated by reference.

1. Field of the Invention

The present invention relates to lithographic projection apparatus and more particularly to lithographic projection apparatus including a vibration isolation system.

2. Description of the Related Art

Lithographic projection apparatus in accordance with the present invention generally include a radiation system for supplying a projection beam of radiation, a support structure for supporting patterning structure, the patterning structure serving to pattern the projection beam according to a desired pattern, a substrate table for holding a substrate, and a projection system for projecting the patterned beam onto a target portion of the substrate.

The term "patterning structure" should be broadly interpreted as referring to means that can be used to endow an incoming radiation beam with a patterned cross-section, corresponding to a pattern that is to be created in a target portion of the substrate; the term "light valve" has also been used in this context. Generally, the said pattern will correspond to a particular functional layer in a device being created in the target portion, such as an integrated circuit or other device (see below). Examples of such pattering structure include:

A mask table for holding a mask. The concept of a mask is well known in lithography, and its includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. The mask table ensures that the mask can be held at a desired position in the incoming radiation beam, and that it can be moved relative to the beam if so desired.

A programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from U.S. Pat. No. 5,296,891 and U.S. Pat. No. 5,523,193, which are incorporated herein by reference.

A programmable LCD array. An example of such a construction is given in U.S. Pat. No. 5,229,872, which is incorporated herein by reference. For purposes of simplicity, the rest of this text may, at certain locations, specifically direct itself to examples involving a mask table and mask; however, the general principles discussed in such instances should be seen in the broader context of the patterning structure as hereabove set forth.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures.

Lithographic projection apparatus can be used, for example, in the manufacture of integrated circuits (ICs). In such a case, the patterning structure may generate a circuit pattern corresponding to an individual layer of the IC, and this pattern can be imaged onto a target portion (comprising one or more dies) on a substrate (silicon wafer) that has been coated with a layer of photosensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus according to the invention a pattern (e.g. in a mask) is imaged onto a substrate that is at least partially covered by a layer of energy-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallisation, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference In a lithographic projection apparatus, it is necessary to control the relative position of the substrate table and the patterning structure with respect to the projection optics in the projection system to a very high degree of accuracy. Transient inaccuracies in this relative position, which may be caused by vibrations, may be detrimental to this accuracy. Lens vibrations may, for example, be caused by floor vibrations, indirect scanning forces (in the case of step-and-scan devices), noise in vibration isolation systems (originating in pneumatic suspension devices in the apparatus) or acoustic noise, among other things.

According to U.S. Pat. Nos. 5,953,105, 6,038,013, 5,187,519, EP 1 041 607 and GB 2 299 867 the above problem may be alleviated by mounting the projection system upon a main plate that is suspended from the rest of the apparatus with a vibration isolation system. The isolation vibration system isolates the main plate and the projection system from vibrations in the rest of the apparatus so that vibrations in the projection optics of the projection system are decreased.

A lithographic projection apparatus may require the positional error of the substrate table (and/or mask table) relative to the lens to be of the order of 2 nm or less. In addition, practical considerations in servo system design can demand that the positional stability of the lens be within tolerances of the order of 1 nm. The inventors have observed that positional errors of this magnitude may be produced by disturbance forces of the order of as little as 1N (acting on a machine that may have a mass of several hundred to several thousand kg). Typically, lithographic projection systems are particularly sensitive to vibrations with low frequencies in the range of 0 to 500 Hz. The desired degree of stability can therefore be very difficult to achieve.

SUMMARY OF THE INVENTION

It is an object of the present invention to provide an improved lithographic projection apparatus in which effective measures are taken to reduce the detrimental effect of lens vibrations.

This and other objects are achieved according to the invention in a lithography apparatus comprising:

a radiation system for providing a projection beam of radiation;

patterning structure, for patterning the projection beam according to a desired pattern;

a substrate table for holding a substrate; and a silent world supported by a vibration isolation system and comprising a projection system for imaging the patterned beam onto a target portion of the substrate;

characterized by:

detection means for detecting relative movement between a first and a second portion of said silent world, and generating at least one movement signal representative thereof;

actuation means responsive to at least one control signal for exerting a force upon said silent world; and control means responsive to said at least one movement signal for generating said at least one control signal, thereby to reduce relative movement between said first and said second portion.

The control provided by the present invention can substantially reduce the effect of vibrations (e.g. in the main frame or base plate of the device) on the relative positions of the lens and tables. This control can be specifically tuned to provide maximum compensation within particular frequency bands, e.g. around the eigenfrequency of the lens.

The present invention may be implemented using lens supports machined from single blocks, each block comprising said detection and actuator means. Co-location of detection and actuation means, such as to form a "set" (or several sets of detection and actuation means), enables the use of a control algorithm which is relatively simple compared to a control algorithm needed when detection and actuation means are not paired in sets. The lens support blocks may be manufactured such that they are compliant in some directions but stiff in others.

According to a further aspect of the invention there is provided a device manufacturing method using a lithographic projection apparatus comprising the steps of:

providing a substrate that is at least partially covered by a layer of radiation-sensitive material;

providing a projection beam of radiation using said radiation system;

using said patterning structure to endow the projection beam with a pattern in its cross-section;

projecting the patterned beam of radiation onto a target area of the layer of radiation-sensitive material using a projecting system provided to a silent world, characterized by the step of detecting relative movement between at least a first and a second portion of said silent world, and generating at least one movement signal representative thereof;

employing actuation means responsive to at least one control signal for exerting a force upon said silent world; and employing control means responsive to said at least one movement signal for generating said at least one control signal, thereby to reduce relative movement between said first and said second portion of said silent world.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target area", respectively.

In the present document, the terms illumination radiation and illumination beam are used to encompass all types of electromagnetic radiation, including ultraviolet radiation (e.g. with a wavelength of 365, 248, 193, 157 or 126 nm) and EUV, as well as particle beams, such as ion beams or electron beams.

BRIEF DESCRIPTION OF THE DRAWINGS

Embodiments of the invention will now be described, by way of example only, with reference to the accompanying schematic drawings in which.

In the Figures, corresponding reference symbols indicate corresponding parts.

DETAILED DESCRIPTION OF EMBODIMENTS OF THE INVENTION

Embodiment 1

Figure 1:
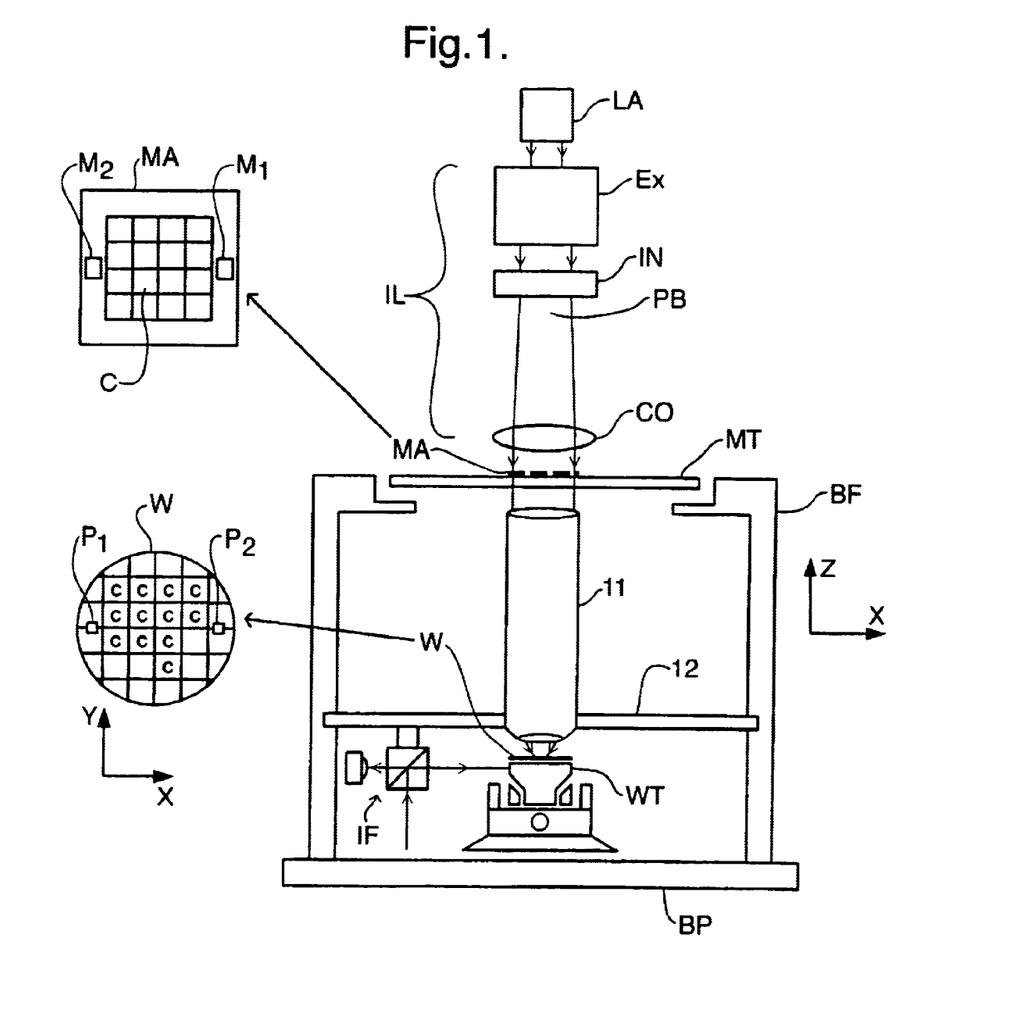
FIG. 1 depicts a lithographic projection apparatus according to an embodiment of the invention.

FIG. 1 schematically depicts a lithographic projection apparatus according to a particular embodiment of the invention. The apparatus comprises:

- a radiation system LA, Ex, IL for supplying a projection beam PB of radiation (e.g. UV or EUV radiation, electrons or ions);
- a first object table (mask table) MT provided with a mask holder for holding a mask MA (e.g. a reticle);
- a second object table (substrate table) WT provided with a substrate holder for holding a substrate W (e.g. a resist-coated silicon wafer), and connected to positioning means for accurately positioning the substrate with respect to item 11;
- a projection system ("lens") 11 (e.g. a refractive or catadioptric, a mirror group or a set of field deflectors) for imaging an irradiated portion of the mask MA onto a target portion C (comprising one or more dies) of the substrate W.

As here depicted, the apparatus is of a transmissive type (i.e. has a transmissive mask). However, in general, it may also be of a reflective type, for example (with a reflective mask). Alternatively, the apparatus may employ another kind of patterning structure, such as a programmable mirror array of a type as referred to above.

The radiation system comprises a source LA (e.g. a lamp or excimer laser, an undulator or wiggler provided around the path of an electron beam stroage ring or synchrotron, a plasma source, or an electron or ion beam source) that produces a beam of radiation. This beam is fed into an illumination system (illuminator) IL, either directly or after being passed through conditioning means, such as a beam expander Ex, for example. The illuminator IL comprises adjusting means for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA which is held in a mask holder on a mask table MT. Having traversed the mask MA, the beam PB passes through the lens 11, which focuses the beam PB onto a target portion C of the substrate W. With the aid of the positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long stroke module (course positioning) and a short stroke module (fine positioning), which are not explicitly depicted in FIG. 1. However, in the case of a wafer stepper (as opposed to a step-and-scan apparatus), the mask table MT may just be connected to a short stroke positioning means, or may be fixed.

The depicted apparatus can be used in two different modes:

1. In step mode, the mask table MT is kept essentially stationary, and an entire mask image is projected at once (i.e. a single "flash") onto a target portion C. The substrate table WT is then shifted in the x and/or y directions so that a different target portion C can be irradiated by the beam PB;
2. In scan mode, essentially the same scenario applies, except that a given target portion C is not exposed in a single "flash". Instead, the mask table MT is movable in a given direction (the so-called "scan direction", e.g. the x direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
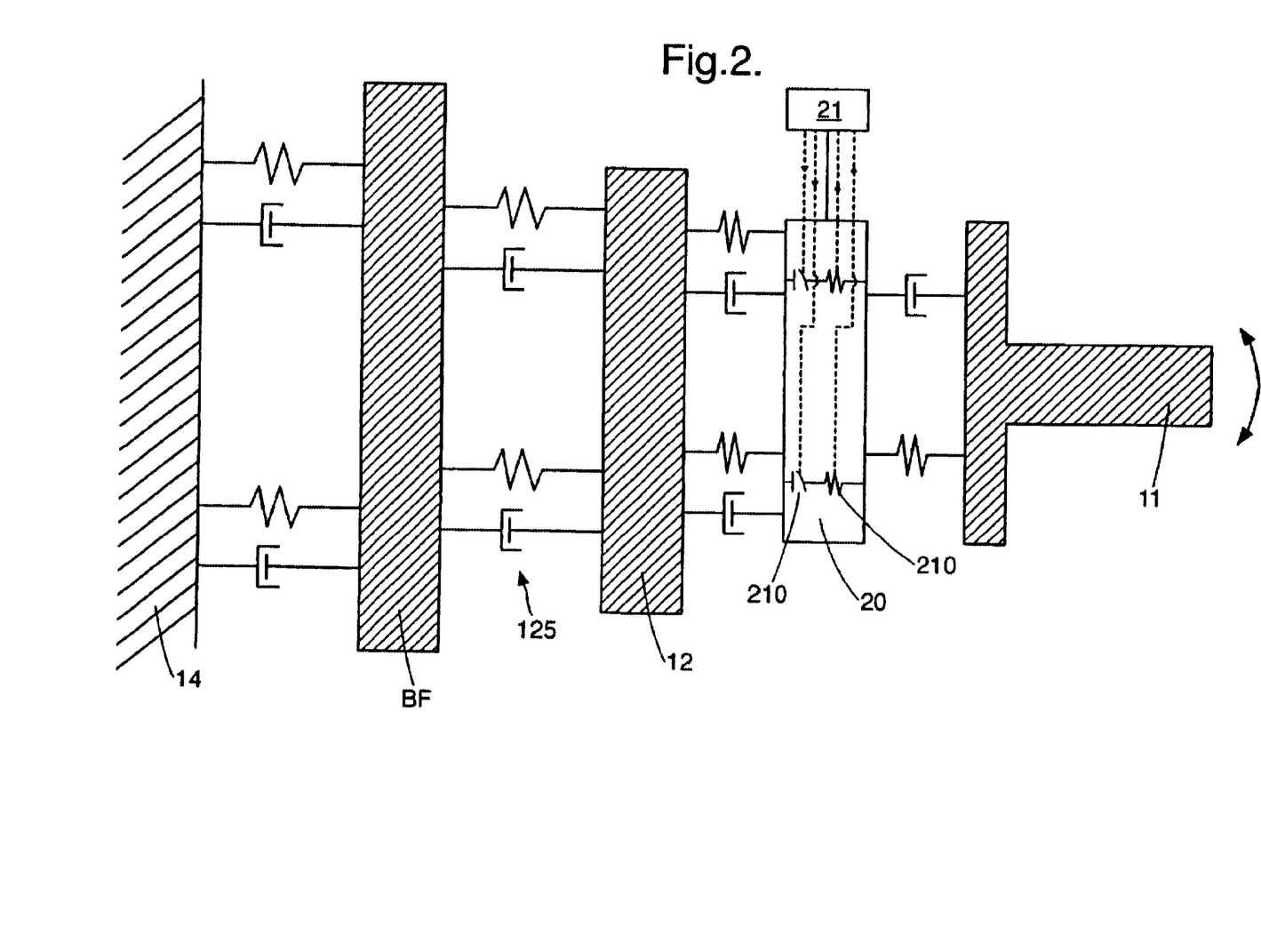
FIG. 2 is a diagram of relevant components of a lithographic projection apparatus to which the present application has been applied.

FIG. 2 is a schematic diagram of the relevant components of a lithographic projection apparatus 10 to which the present invention is applied. The components are represented as masses, and the interconnections between them as springs and dampers.

In FIG. 2, the lens 11 is mounted through detection and actuation means 20 on a main plate 12 which in turn is mounted on a base frame BF via an vibration isolation system 125, for example an air bearing. The base frame BF is mounted on a floor 14, which is considered rigid for analysis purposes. The main plate 12 serves as the metrology frame for the apparatus and as such may have components of inferometers and other measuring equipment attached. Together with the projection system the main plate is considered as the "silent world" because it is vibration isolated from the rest of the apparatus and there will be no actuator exerting a force on said "silent world" so that it will form a good reference for measurements. The term "silent world" however, should be understood not to require a main plate or other specific components as in the above embodiment, but rather indicates generally a vibration isolated portion of the apparatus.

In a typical lithographic projection apparatus, the lens 11 will often have a mass of the order of about 250 to 750 kg, and an eigenfrequency in the approximate range 50 to 150 Hz. The mass of each of the main plates 12 and base frame BF will generally be of the order of several hundred to a few thousand kg, and the eigenfrequency of the compound system consisting of the parts 11, 12 and BF will typically lie in the range 1 to 20 Hz.

The detection means 210 detects any relative movement between the main plate and the lens and generates at least one movement signal in response thereto. These signals are sent to controller 21 which processes the information and sends a control signal to the actuation means 220 to move the lens relative to the main plate, thereby to reduce relative movement between the lens and the main plate.

If the frequency response of the lens, without the controller 21 activated, is known, the controller can most easily be tuned to compensate for vibrations in desired frequency bands. At present it is intended to provide the controller with values for a pole position and a gain. The pole position relates to the position of an eigenfrequency of the lens and the gain relates to the magnitude of the outgoing control signal. Generally, the pole position is to be located at a frequency below the eigen frequency.

Figure 3A:
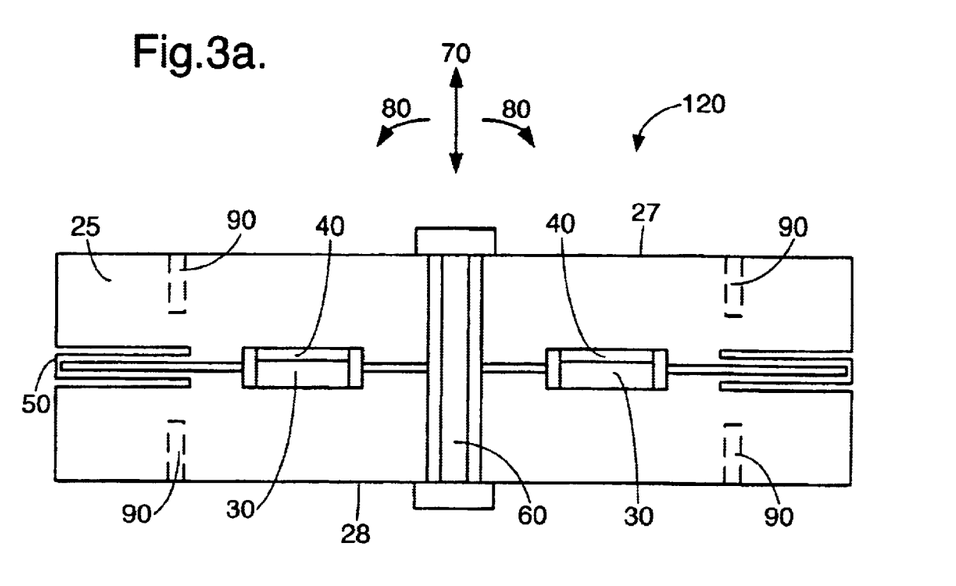
FIG. 3a is a cross-sectional view of a lens support block comprising co-located detection and actuation means.

In the illustrated embodiment the detection and actuation means 20 comprises a plurality of lens supports 120 depicted schematically in cross section in FIG. 3a. A lens support 120 comprises a solid metal case 25 which has had bellows 50 integrally manufactured therein such that the block 25 may extend and retract in the direction indicated by arrow 70 and may also bend in the directions indicated by arrows 80, that is so that the top and bottom surface 27, 28 rotate relative to each other. The block 25 may, for example, be stiff in the direction perpendicular to arrow 70 (in and out of the page as illustrated). These bellows 50 may, for example, be manufactured into the block 25 by spark erosion. Each lens support 120 comprises, in parallel, two sets of an actuator piezoelectric block 30 and a force sensor piezoelectric block 40, in series (corresponding to the pair of detection and actuation means). Because the piezoelectric blocks 30, 40 should, in principle, not be put in tension, the whole block 25 may be put into compression by bolt 60 tightened to press the top and bottom surfaces 27, 28 together. The bellows 50 enable simple mounting of the piezoelectric blocks 30 and 40.

Movement between the top surface 27 and bottom surface 28 (opposite surfaces) of the block 25 results in a voltage, for instance proportional to force, in the sensor piezoelectric blocks 40. Rotational moments about the bolt 60 result in different voltages in each of the sensor piezoelectrics blocks 40 and such rotation is thereby measurable. In this way, it is possible to sense rotational moments as well as vertical movements in lens support 120 and send movement signals representative of movement of the top and bottom surface 27, 28 to controller 21. The attachment holes 90 provide for the attachment of the lens supports between the main plate 12 and the lens 11.

By applying a control signal voltage across piezoelectric actuator blocks 30 the top and bottom surfaces 27, 28 of the lens support 120 may be moved apart or together and the top and bottom surfaces 27, 28 may be rotated relative to each other.

Figure 3B:
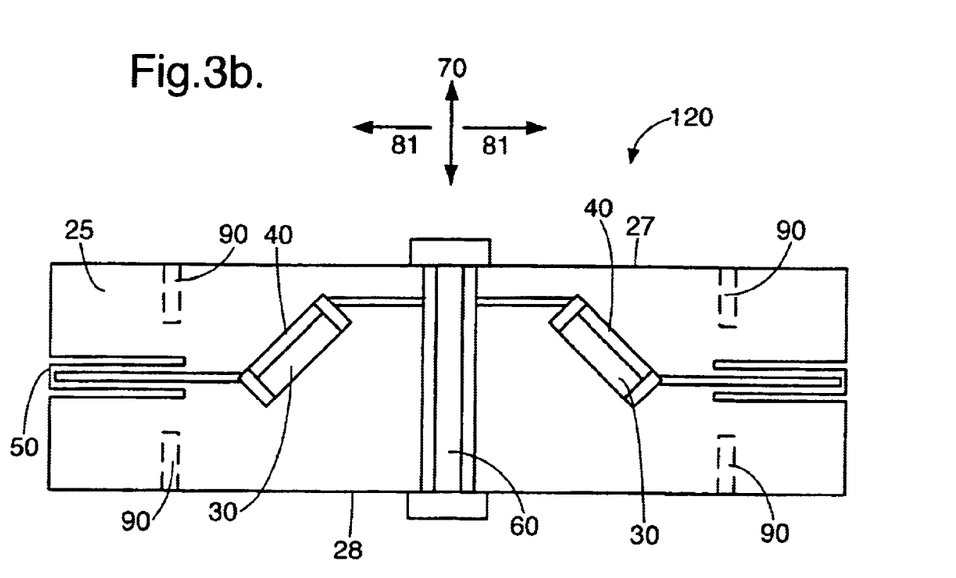
FIG. 3b is a cross-sectional view of a lens support block comprising tilted, co-located, detection and actuation means.

In another embodiment the piezo-stacks formed by the elements 30 and 40 are tilted with respect to the top and bottom surfaces 27, 28. This is shown in FIG. 3b. A shearing movement of the top surface 27 with respect to the bottom surface 28 (said movement being indicated by arrow 81) results in voltage signals of opposite sign in the sensor piezoelectric blocks 40. As in FIG. 3a, a "compression" movement of the top surface 27 with respect to the bottom surface 28 in the direction of arrow 70 results in sensor signals of equal sign. In this way, it is possible to address, through controller 21, the alleviation of vibrations resulting from the occurrence of said shearing and compression movements 81 and 70.

Figure 4:
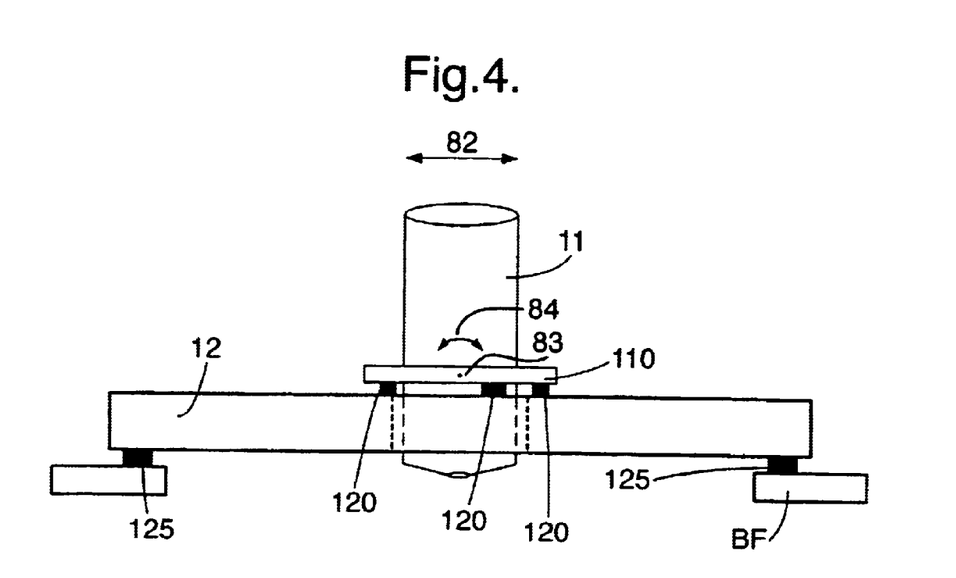
FIG. 4 is a cross-sectional view of a main plate and projection system attached thereto.

FIG. 4 is a cross sectional view of how the main plate 12 and lens 11 are attached. The main plate 12 is attached to the base frame BF via air mounts 125. Three lens supports 120 are rigidly attached by their bottom surfaces 28 to the main plate 12, and to a flange 110 of lens 11 by their top surfaces 27. The lens supports 120 are spaced radially equally around circumference flange 110 of lens 11.

In this way any relative movement, tilting or displacement between the main plates 12 and lens 11 will result in a voltage being generated in at least one of the six force sensor piezoelectric blocks 40. A suitably programmed controller 21 can then be used to apply control voltages across at least one of the six actuator piezoelectric blocks 30 to compensate for the detected motion and to reduce the relative motion between the lens 11 and the main plate 12.

In order to use the arrangement illustrated in FIG. 4 for improving device performance, a controller structure and design procedure must be correctly chosen. The controller structure determines what kind of influence the controller has on a given system. It can, for example, add damping or stiffness or both, depending on the controller structure.

At present it is intended to add only active damping using an integral force feedback controller. To accomplish this, the controller has a transfer function which is a leaking integrator with a given pole location and a gain. This means that the voltage output of a given force sensor 40 is multiplied by a frequency dependant gain and applied to the relevant piezoelectric actuator 30. The frequency dependence is determined by the chosen pole position. This system has the advantage that its structure is simple and intuitive and that, for a given system, it is always stable if there is no significant additional phase lag between the movement and control signals due to delays or filters.

A suitable transfer function is:

$$\frac{U_{in}(s)}{U_{out}(s)} = -\frac{\beta}{s+\alpha}$$

Where $U_{in}$ is the voltage applied to the actuator amplifier, $U_{out}$ is the voltage from the sensor amplifier, $\beta$ is the gain and $\alpha$ the pole location.

The gain and the location of the pole can be varied to optimize the controller so as to reach the ultimate goal: reducing the amplitude of vibrations, for instance at the lens-top. The vibration amplitude is determined by the excitation which is applied to the main plate 12 and by the sensitivity of the construction of detection and actuation means 20 and the controller 21.

A particular vibration, which the present invention is intended to subsequently compensate for, is the so called "joy-stick mode". In this mode, the flange 110 of the lens 11 remains substantially stationary relative to the main plate 12 but the top of the lens 11 furthest from the flange (and therefore connection points of the lens 11 to the main frame 12) moves a relatively great distance (see arrow 82). To represent the joy-strick nature of the movement, the lens-top movement 82 in FIG. 4 can be expressed as a "relative rotation" 84 (in the plane of the figure, relative to the main plate 12), of the lens 11 around an assumed center of rotation 83.

Figure 5A:
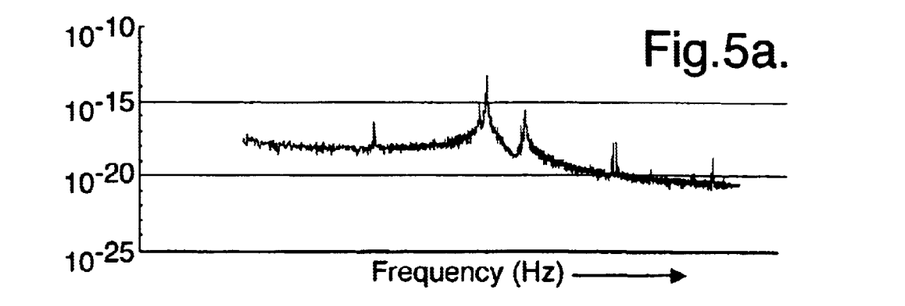
FIGS. 5a–d are Bode plots of experimental results of the frequency response of a lens under different conditions. The power spectral density, in $(Radians)^2/Hz$, is plotted along the vertical axis as a function of frequency.
Figure 5B:
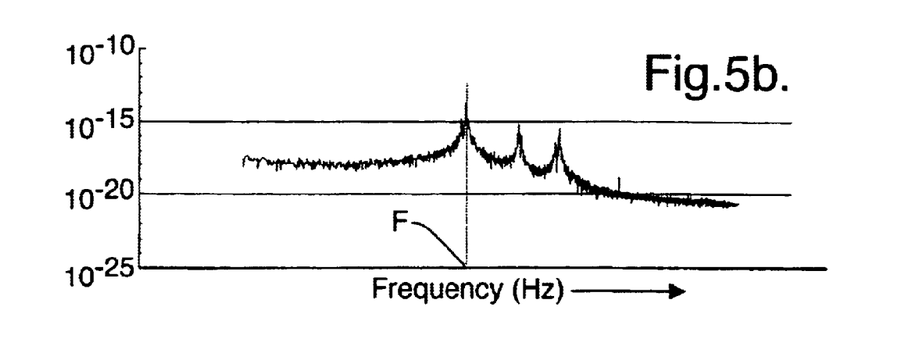

FIGS. 5a and 5b are Bode plots of the relative rotation 84 for a white noise signal supplied to the airmounts 125. FIG. 5a is for a lens supported conventionally and FIG. 5b is for a lens supported by the detection and actuation means 20 described above, though not connected to the controller 21. The frequency response for the situation when the detection and actuation means 20 connects the lens 11 to the main plate 12 is important because the control parameters of the controller can be optimized most easily from knowing those paramenters.

Figure 5C:
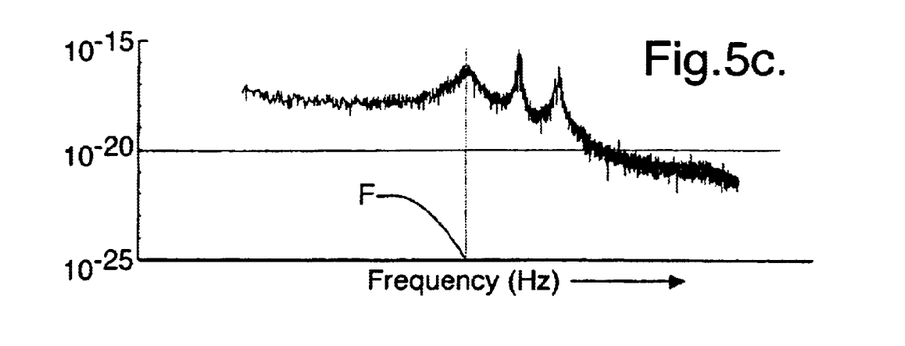
Figure 5D:
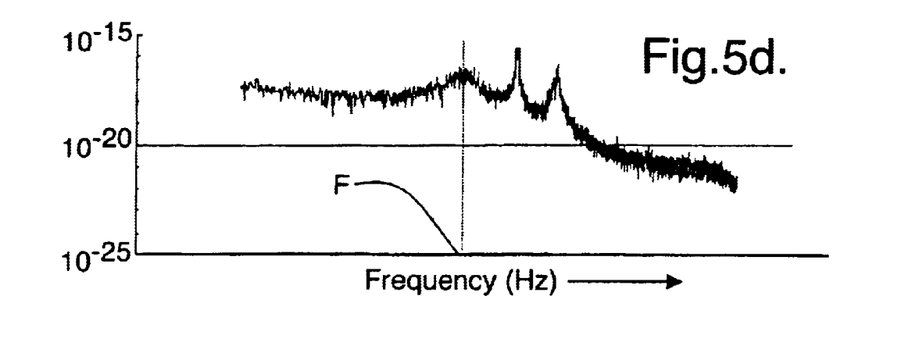

FIGS. 5c and 5d show the results where the pole of the controller is set to be substantially at the first peak in the frequency response curve 5b at frequency F. The difference between the two plots is that the gain is larger in frequency response curve 5d than in frequency response curve 5c and, as can be clearly seen, this results in a reduction in the amplitude of the curve at the first pole. This shows that the controller of the present invention can be tuned to reduce vibrational movement at a given frequency.

Embodiment 2

Figure 6:
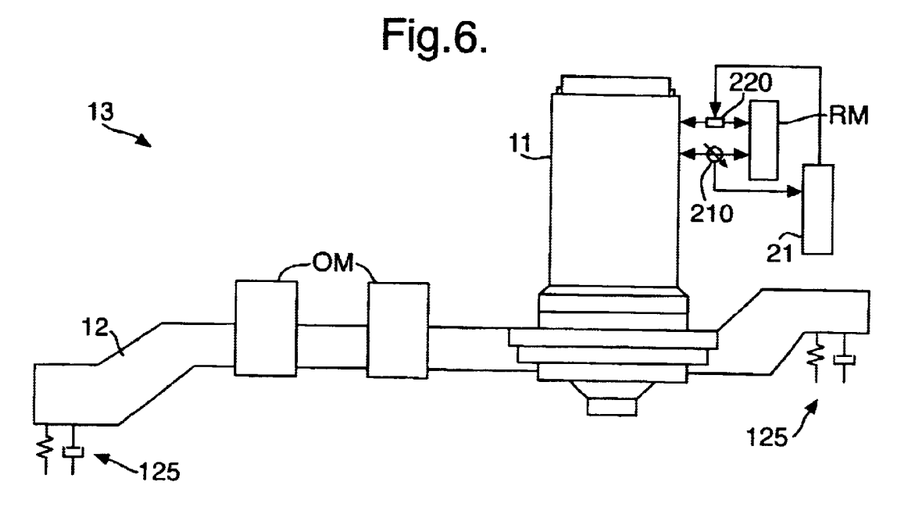
FIGS. 6 and 7 depict a silent world according to a second embodiment of the invention.
Figure 7:
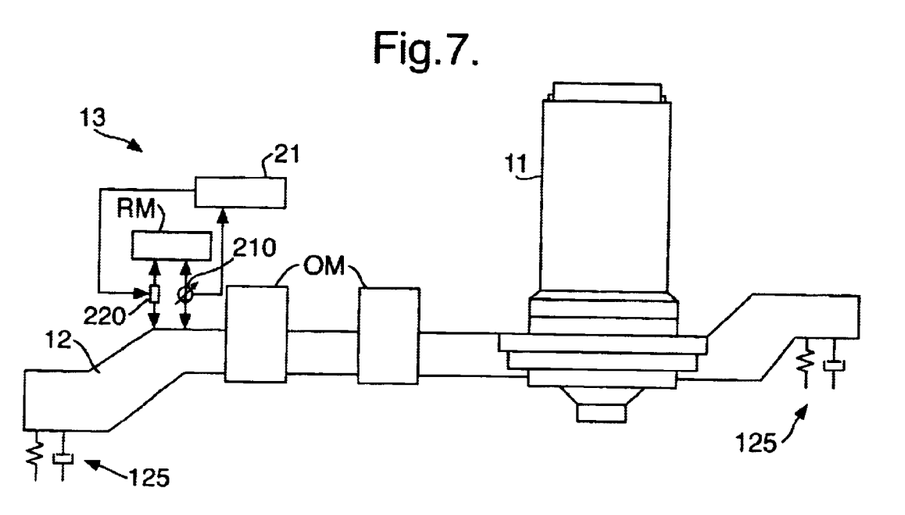

FIGS. 6 and 7 describe further embodiments of the invention. The silent world 13 comprising the projection system 11 and the main plate 12 is suspended from the rest of the lithographic apparatus by airmounts 125. The silent world 13 is also provided with the optical measurement system OM that is used in a twin stage lithographic projection apparatus to perform measurement of the substrate topology using alignment sensors and leveling sensors at the measurement position. Twin stage lithographic apparatus are described, for example, in U.S. Pat. No. 5,969,441 and U.S. Ser. No. 09/180,011, filed Feb. 27, 1998 (WO 98/40791), incorporated herein by reference. The silent world may also be provided with an interferometry system for determining the position of the substrate table WT in a lithographic projection apparatus. That the projection system 11 and the optical measurement system OM are both in the same silent world 13 and that there is a very rigid connection between both via the main plate 12 makes it possible to reproduce measurement from the optical measurement system OM at the exposure position underneath the projection system 11 with a very high accuracy. The silent world 13 is further provided with a reaction mass RM that is freely movable in one or more degrees of freedom with respect to the rest of the silent world 12. The detection means 210 detects relative displacement between the reaction mass RM and the rest of the silent world 13 and sends at least one movement signal in response thereto to the controller 21. The controller 21 processes this information and sends a control signal to the actuation means 220 for displacing the reaction mass RM with respect to the rest of the silent world 13 so as to reduce vibrations in the silent world 13. FIG. 6 shows that the reaction mass RM the detection means 210 and the actuation means 220 are provided to exert a force upon the lens 11. The latter is advantageously because this may be very helpful to decrease the amount of swing of the top of the lens with respect to the main plate 12. In FIG. 7 one of the outer ends of the main plate 12 is provided with the detection and actuation means. One could also consider to use a combination of the embodiments in FIGS. 6 and 7. In that way the detection means 210 located near the top of the lens 11 in FIG. 6 can be used to provide a control signal for the actuation means 220 in FIG. 7 positioned at an end of the main plate. This generally involves a lot of calibration and calculation because the exertion of force will be done at a different positions then where the detection occurs. It therefore may be advantageous to do both at the same location of the silent world 13.

While specific embodiments of the invention have been described above, it will be appreciated that the invention may be practiced otherwise than as described. The description is not intended to limit the invention.

What is claimed is:

1. A lithographic projection apparatus comprising:
   a radiation system to provide a projection beam of radiation;
   a table to support patterning structure, which pattering structure can be used to pattern the projection beam according to a desired pattern;
   a substrate table to hold a substrate; and
   a vibrationally isolated portion of the apparatus silent world supported by a vibration isolation system and comprising a projection system to image the patterned beam onto a target portion of the substrate;
   a detector to observe relative movement between a first and a second portion of said vibrationally isolated portion of the apparatus, and generating at least one movement signal representative thereof;
   an actuator responsive to at least one control signal for exerting a force upon a portion of said vibrationally isolated portion of the apparatus; and
   a controller responsive to said at least one movement signal to generate said at least one control signal to reduce relative movement between said first and said second portion.

2. A lithographic projection apparatus according to claim 1 wherein said actuator is constructed and arranged to exert a force upon the first or second portion.

3. A lithographic projection apparatus according to claim 1 wherein said actuator is constructed and arranged to exert said force by accelerating a reaction mass with respect to a remaining portion of said vibrationally isolated portion of the apparatus.

4. A lithographic projection apparatus according to claim 3, wherein said detector detects relative displacement between said reaction mass and the remaining portion of the vibrationally isolated portion of the apparatus.

5. A lithographic projection apparatus according to claim 1, wherein said detector and said actuator are constructed and arranged to connect said first portion with said second portion.

6. A lithographic projection apparatus according to claim 5, wherein said first portion is the projection system and said second portion comprises a main plate to support the projection system.

7. A lithographic projection apparatus according to claim 6, wherein the detector detects relative tilt between said projection system and said main plate, said actuator is adapted to tilt said projection system relative to said main plate, and said controller generates said at least one control signal to reduce relative tilt between said projection system and said main plate.

8. A lithographic projection apparatus according to claim 1, wherein said first portion is the projection system and said second portion comprises a main plate for supporting the projection system.

9. A lithographic projection apparatus according to claim 6, wherein said detector detects relative displacement between said projection system and said main plate, and said actuator is for displacing said projection system relative to said main plate.

10. An apparatus according to claim 1, wherein said detector, actuator and controller are adapted to detect and reduce relative movements between portions of the vibrationally isolated portion of the apparatus having a frequency in the range 20–200 Hz.

11. An apparatus according to claim 1, wherein said detector, actuator and controller are tuned to compensate for movements of the projection system in a frequency band around its eigenfrequency.

12. An apparatus according to claim 11, wherein said frequency band comprises frequencies within +/−20 Hz of the eigenfrequency.

13. An apparatus according to claim 1, wherein said detector and actuator comprise a plurality of parallel sets of piezoelectric sensor blocks connected in series with actuator blocks, said plurality of sets connecting said projection system to a main plate.

14. A device manufacturing method using a lithographic projection apparatus comprising:

projecting a patterned beam of radiation onto a target area of a layer of radiation-sensitive material on a substrate;

detecting relative movement between at least a first and a second portion of a vibrationally isolated portion of the apparatus comprising at least a portion of a projection system of the projection apparatus;

generating at least one movement signal representative of the detected relative movement;

exerting a force upon a portion of said vibrationally isolated portion of the apparatus responsive to at least one control signal; and generating said at least one control signal responsive to said movement signal to reduce relative movement between said first and said second portion of said vibrationally isolated portion of the apparatus.

15. A device manufactured in accordance with the method of claim 14.

* * * * *

UNITED STATES PATENT AND TRADEMARK OFFICE
CERTIFICATE OF CORRECTION

PATENT NO. : 6,791,664 B2
DATED : September 14, 2004
INVENTOR(S) : Frank Auer et al.

It is certified that error appears in the above-identified patent and that said Letters Patent is hereby corrected as shown below:

Title page,
Item [54], Title, replace "LITHOGRAPHIC APPARATUS, DEVICE MANUFACTURING METHOD, AND DEVICE MANUFACTURING THEREBY" with -- LITHOGRAPHIC APPARATUS, DEVICE MANUFACTURING METHOD, AND DEVICE MANUFACTURED THEREBY ⌐--

Signed and Sealed this

Twenty-sixth Day of April, 2005

JON W. DUDAS
*Director of the United States Patent and Trademark Office*